(12) United States Patent
Woo et al.

(10) Patent No.: US 10,516,127 B2
(45) Date of Patent: Dec. 24, 2019

(54) QUANTUM ROD PANEL AND QUANTUM ROD DISPLAY DEVICE

(71) Applicant: LG DISPLAY CO., LTD., Seoul (KR)

(72) Inventors: Sung-Il Woo, Paju-si (KR);
Byung-Geol Kim, Paju-si (KR);
Kyu-Nam Kim, Paju-si (KR);
Kyung-Kook Jang, Paju-si (KR);
Tae-Yang Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/724,374

(22) Filed: Oct. 4, 2017

(65) Prior Publication Data

US 2018/0102493 A1    Apr. 12, 2018

(30) Foreign Application Priority Data

Oct. 10, 2016 (KR) .................. 10-2016-0130532

(51) Int. Cl.

| | |
|---|---|
| *H01L 51/50* | (2006.01) |
| *H01L 33/06* | (2010.01) |
| *G02F 1/17* | (2019.01) |
| *G02F 2/02* | (2006.01) |
| *G02F 1/1335* | (2006.01) |
| *H01L 27/15* | (2006.01) |
| *H01L 33/50* | (2010.01) |

(52) U.S. Cl.
CPC .......... *H01L 51/502* (2013.01); *G02F 1/1335* (2013.01); *G02F 1/133504* (2013.01); *G02F 1/174* (2013.01); *G02F 2/02* (2013.01); *H01L 33/06* (2013.01); *G02F 2202/34* (2013.01); *G02F 2202/36* (2013.01); *G02F 2203/34* (2013.01); *H01L 27/15* (2013.01); *H01L 33/501* (2013.01); *H01L 33/507* (2013.01)

(58) Field of Classification Search
CPC ..................................... H01L 51/502
USPC ..................................... 257/40, 59
See application file for complete search history.

(56) References Cited

U.S. PATENT DOCUMENTS

| | | | |
|---|---|---|---|
| 2006/0001803 A1* | 1/2006 | Park | ............... G02F 1/13439 349/113 |
| 2011/0109854 A1* | 5/2011 | Tang | ............... G02F 1/195 349/117 |
| 2011/0116168 A1 | 5/2011 | Nikoobakht | |
| 2015/0146452 A1 | 5/2015 | Kim et al. | |

FOREIGN PATENT DOCUMENTS

| | | |
|---|---|---|
| EP | 3020784 A1 | 5/2016 |
| KR | 10-2013-0060473 A | 6/2013 |
| KR | 10-2016-0002555 A | 1/2016 |
| KR | 10-2016-0036732 A | 4/2016 |

\* cited by examiner

*Primary Examiner* — Lex H Malsawma
*Assistant Examiner* — Eric W Jones
(74) *Attorney, Agent, or Firm* — Birch, Stewart, Kolasch & Birch, LLP

(57) ABSTRACT

A quantum rod panel includes a first substrate and a second substrate facing each other, a pixel electrode and a common electrode over the first substrate and spaced apart from each other, and a quantum rod layer between the pixel electrode and the common electrode and including quantum rods and metal particles.

24 Claims, 6 Drawing Sheets

QUANTUM ROD PANEL AND QUANTUM ROD DISPLAY DEVICE

CROSS-REFERENCE TO RELATED APPLICATION

The present application claims priority under U.S.C. § 119(a) to Korean Patent Application No. 10-2016-0130532 filed on Oct. 10, 2016, which is hereby incorporated by reference in its entirety into the present application.

BACKGROUND

Field of the Disclosure

The present disclosure relates to a display device, and more particularly, to a quantum rod panel and a quantum rod display device having a relatively low driving voltage.

Discussion of the Related Art

Recently, as the society has entered upon an information age, a field of display devices that represent all sorts of electrical signals as visual images has developed rapidly. Flat panel display devices, such as a liquid crystal display (LCD) device, a plasma display panel (PDP) device, a field emission display (FED) device, and an organic light emitting diode (OLED) device, have been introduced.

On the other hand, use of a quantum rod to the display device has been researched and studied. Since the quantum rod has a high emitting efficiency and excellent reproducibility, the quantum rod can be applied to various uses. For example, applications of the quantum rod to an emitting diode for lightings and a light source or other elements for the LCD device have been researched.

The quantum rod includes a nano-sized core of II-VI, III-V, or VI-IV semiconductor particle and a shell covering the core.

Since extinction coefficient and quantum yield of the quantum rod is very large in comparison to general dyes, the quantum rod emits strong fluorescent light. In addition, by controlling a diameter of the quantum rod, a wavelength of light emitted from the quantum rod can be controlled.

The quantum rod emits linearly-polarized light. Namely, the light from the quantum rod has a linearly-polarized property along a length direction of the quantum rod.

In addition, the quantum rod has an optical property that is capable of controlling emission by an electric field applied from the outside. This may be referred to as stark effect.

The quantum rod panel and the quantum rod display device according to the related art, however, have problems of a high driving voltage and an increase in power consumption.

SUMMARY

Accordingly, the present disclosure is directed to a quantum rod panel and a quantum rod display device that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present disclosure, as embodied and broadly described herein, there is provided a quantum rod panel including a first substrate and a second substrate facing each other, a pixel electrode and a common electrode over the first substrate and spaced apart from each other, and a quantum rod layer between the pixel electrode and the common electrode and including quantum rods and metal particles.

In another aspect, a quantum rod display device comprises a quantum rod panel including: a first substrate and a second substrate facing each other, a pixel electrode and a common electrode over the first substrate and spaced apart from each other, and a quantum rod layer between the pixel electrode and the common electrode and including quantum rods and metal particles; and a backlight unit under the quantum rod panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and which are incorporated in and constitute a part of this specification, illustrate embodiments of the invention and together with the description serve to explain the principles of the invention. In the drawings.

DETAILED DESCRIPTION

Reference will now be made in detail to embodiments of the disclosure, examples of which are illustrated in the accompanying drawings.

<First Embodiment>

Figure 1:
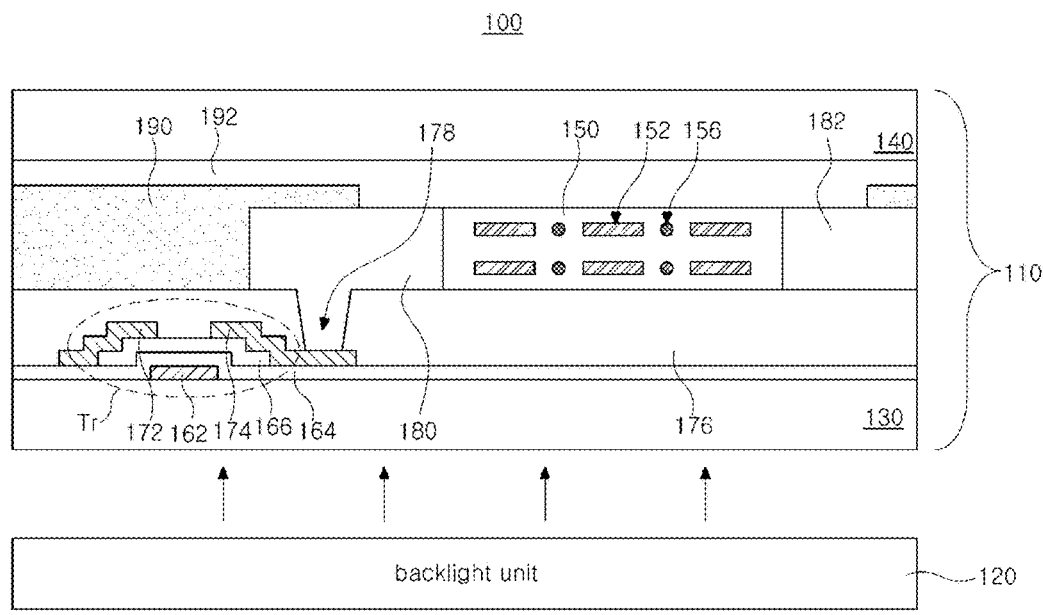
FIG. 1 is a schematic cross-sectional view of a quantum rod display device according to a first embodiment of the present disclosure.

FIG. 1 is a schematic cross-sectional view of a quantum rod display device according to a first embodiment of the present disclosure. All the components of the quantum rod display device according to all embodiments of the present disclosure are operatively coupled and configured.

In FIG. 1, a quantum rod display device 100 according to the first embodiment of the present disclosure includes a quantum rod panel 110 and a backlight unit 120 under the quantum rod panel 110. The backlight unit 120 provides light to the quantum rod panel 110.

The quantum rod panel 110 includes a first substrate 130, which is adjacent to the backlight unit 120, pixel and common electrodes 180 and 182, which are positioned over the first substrate 130, a second substrate 140, which faces the first substrate 130, and a quantum rod layer 150, which is positioned between the first and second substrates 130 and 140 and includes quantum rods 152 and metal particles 156.

Each of the first and second substrates 130 and 140 may be a glass substrate or a plastic substrate. For example, when the first and second substrates 130 and 140 each are flexible substrates such as polyimide, the quantum rod display device 100 of the present disclosure may be used as a foldable, bendable or rollable display device.

A gate line and a data line are formed over the first substrate 130 and cross each other to define each of a plurality of pixel regions.

A thin film transistor Tr is formed in each pixel region, and the pixel electrode 180 is electrically connected to the thin film transistor Tr.

The thin film transistor Tr may include a gate electrode 162 formed over the first substrate 130, a semiconductor layer 166 formed over the gate electrode 162 and overlapping the gate electrode 162, and source and drain electrodes 172 and 174 spaced apart from each other over the semiconductor layer 166.

More specifically, the gate line extends along a first direction, and the gate electrode 162 is connected to the gate line. A common line may be formed on the first substrate 130 and may be spaced apart from and parallel to the gate line.

The gate line, the common line and the gate electrode 162 each may be formed of a metal material having relatively low resistivity. For instance, the gate line, the common line and the gate electrode 162 each may be formed of one of aluminum (Al), aluminum alloy (AlNd), molybdenum (Mo), copper (Cu) and copper alloy.

A gate insulating layer 164 is formed on the first substrate 130 and covers the gate line, the common line and the gate electrode 162. The gate insulating layer 164 may be formed of an inorganic insulating material such as silicon oxide or silicon nitride.

The semiconductor layer 166 is disposed on the gate insulating layer 164 and corresponds to the gate electrode 162. The semiconductor layer 166 may be formed of an oxide semiconductor material. An etch stopper may be formed on the semiconductor layer 166 to correspond to a central portion of the semiconductor layer 166.

Meanwhile, the semiconductor layer 166 may have a double-layered structure including an active layer of intrinsic amorphous silicon and ohmic contact layers of impurity-doped amorphous silicon.

The source and drain electrodes 172 and 174 are spaced apart from each other and are disposed over the semiconductor layer 166. The source and drain electrodes 172 and 174 each may be formed of a metal material having relatively low resistivity. For example, the source and drain electrodes 172 and 174 each may be formed of one of aluminum (Al), aluminum alloy (AlNd), molybdenum (Mo), copper (Cu) and copper alloy.

The source electrode 172 is connected to the data line. Namely, the thin film transistor Tr is electrically connected to the gate line and the data line.

A passivation layer 176 is formed over and covers the thin film transistor Tr, and the passivation layer 176 has a drain contact hole 178 exposing the drain electrode 174. The passivation layer 176 may be formed of an inorganic insulating material such as silicon oxide or silicon nitride or an organic insulating material such as benzocyclobutene (BCB) or photo acryl.

The pixel electrode 180 and the common electrode 182 are disposed on the passivation layer 176 and spaced apart from each other. The pixel electrode 180 is connected to the drain electrode 174 through the drain contact hole 178 of the passivation layer 176. The common electrode 182 is connected to the common line through a common contact hole formed in the gate insulating layer 164 and the passivation layer 176. The pixel electrode 180 and the common electrode 182 may extend parallel to each other.

Each of the pixel electrode 180 and the common electrode 182 may be formed of a reflective conductive material such as aluminum (Al), aluminum alloy (AlNd), molybdenum (Mo), copper (Cu) and copper alloy or a transparent conductive material such as indium tin oxide (ITO) and indium zinc oxide (IZO).

In addition, a partition wall 190 is formed on the passivation layer 176 to divide pixel regions. That is, the partition wall 190 may surround each pixel region and have a lattice shape. The quantum rod layer 150 is divided into the pixel regions by the partition wall 190, and red, green and blue can be produced in the respective pixel regions. The partition wall 190 can be omitted.

Moreover, the quantum rod layer 150 is disposed on the passivation layer 176 and is divided into the pixel regions by the partition wall 190. Namely, the quantum rod layer 150 contacts the pixel electrode 180 and the common electrode 182. Furthermore, a bottom surface of the quantum rod layer 150 contacts the passivation layer 176.

The quantum rod layer 150 includes the quantum rods 152 and the metal particles 156. In addition, the quantum rod layer 150 may be formed through a soluble process and may further include a binder.

Figure 2:
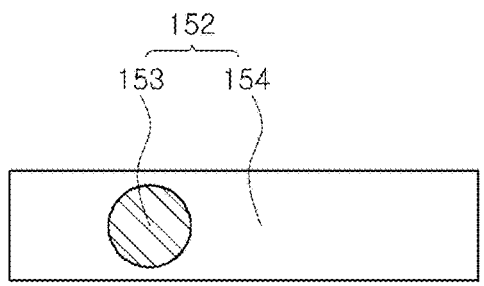
FIG. 2 is a schematic cross-sectional view for explaining a quantum rod according to an example of the present disclosure.

Referring to FIG. 2, which is a schematic cross-sectional view for explaining an example of the quantum rod 152, where each quantum rod 152 includes a core 153 and a shell 154 covering the core 153. The core 153 and the shell 154 each may include at least one of II-VI, III-V or VI-IV semiconductor materials.

For example, each of the core 153 and the shell 154 of the quantum rod 152 may be formed of one or a mixture of more than two of CdSe, CdS, CdTe, ZnSe, ZnS, ZnTe, HgSe, HgTe, CdZnSe (II-VI semiconductor materials), InP, InN, GaN, InSb, InAsP, InGaAs, GaAs, GaP, GaSb, AlP, AlN, AlAs, and AlSb (III-V semiconductor materials), and PbSe, PbTe, and PbS (VI-IV semiconductor materials).

The metal particles 156 are dispersed together with the quantum rods 152 in the binder and have relatively low resistivity. Therefore, an intensity of an electric field generated between the pixel electrode 180 and the common electrode 182 increases due to the metal particles 156, and a driving voltage of the quantum rods 152 decreases.

In the quantum rod panel 110 and the quantum rod display device 100, electrons and holes are separated by the electric field generated between the pixel electrode 180 and the common electrode 182, thereby controlling on and off of the quantum rod panel 110 and the quantum rod display device 100. At this time, to turn off the quantum rods 152, an electric field may be needed to have the intensity higher than an energy barrier between the core 153 and the shell 154, and thus a driving voltage of the quantum rod panel and the quantum rod display device may increase.

However, in the present disclosure, since the quantum rod layer 150 includes the quantum rods 152 and the metal particles 156, the intensity of the electric field generated between the pixel electrode 180 and the common electrode 182 increases. Accordingly, the driving voltage of the quantum rod panel 110 and the quantum rod display device 100 is decreased, and the power consumption is lowered.

Additionally, the metal particles 156, beneficially, have relatively high reflectivity. That is, the metal particles 156 reflect light from the backlight unit 120, and the absorbance of the quantum rods 152 increases. Thus, the photoluminescence of the quantum rod panel 110 and the quantum rod display device 100 can be improved.

For instance, the metal particles 156 may be formed of a metal material having relatively low resistivity and high reflectance such as gold (Au), silver (Ag), titanium (Ti) and aluminum (Al). Moreover, the metal particles 156 may have a size of 100 to 300 nm and the content of about 1 to 15 wt % with respect to the quantum rods 152.

A planarization layer 192 is formed on the partition wall 190 and the quantum rod layer 150. The planarization layer 192 flattens steps, which may be caused by the partition wall 190 and the quantum rod layer 150. The planarization layer 192 may be omitted.

The second substrate 140 is disposed over the planarization layer 192. The second substrate 140 may be attached to the planarization layer 192 by an adhesive layer. The second substrate 140 may be a glass substrate, a plastic substrate, a plastic film, an insulating film, or an encapsulation film. The shape and material of the second substrate 140 are not limited.

The backlight unit 120 includes a UV light source. Namely, since the quantum rods 152 absorb UV and emit visible light, the backlight unit 120 includes the UV light source and provides UV to the quantum rod panel 110.

The backlight unit 120 may be a direct-type in which a plurality of UV light sources are arranged under the quantum rod panel 110 and provide UV directly to the quantum rod panel 110. The direct-type backlight unit 120 may further include a reflection plate under the UV light sources and an optical sheet between the UV light sources and the quantum rod panel 110.

Alternatively, the backlight unit 120 may be an edge-type in which a light guide plate is disposed under the quantum rod panel 110 and the UV light source is disposed at a side of the light guide plate. The edge-type backlight unit 120 may further include a reflection plate under the light guide plate and an optical sheet between the light guide plate and the quantum rod panel 110.

In the present disclosure, the pixel electrode 180 and the common electrode 182 are disposed over the first substrate 130 to generate an in-plane electric field parallel to the first substrate 130.

Figure 3:
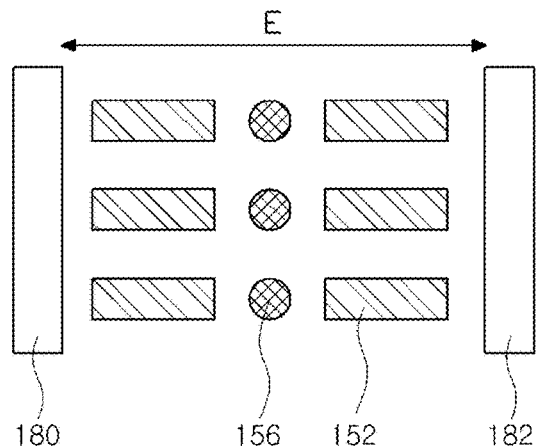
FIG. 3 is a schematic plan view for explaining a driving mechanism of the quantum rod display device of the present disclosure.

Referring to FIG. 3, which is a schematic plan view for explaining a driving mechanism of the quantum rod display device of the present disclosure, the quantum rods 152 are arranged such that their long axes are parallel to the electric field E generated between the pixel electrode 180 and the common electrode 182, and the metal particles 156 are arranged between the quantum rods 152. That is to say, the quantum rods 152 are arranged such that their long axes are perpendicular to an extension direction of the pixel electrode 180 and the common electrode 182.

Like this, when the UV from the backlight unit 120 is provided to the quantum rod layer 150, which includes the quantum rods 152 arranged perpendicularly to the extension direction of the pixel electrode 180 and the common electrode 182, visible light linearly polarized in a direction of the long axes of the quantum rods 152 is emitted from the quantum rods 152.

In the meantime, when the electric field E is applied to the quantum rod layer 150, the quantum rods 152 do not emit light. Therefore, by using the in-plane electric field between the pixel electrode 180 and the common electrode 182, the polarization properties of the quantum rod panel 110 and the quantum rod display device 100 are improved, and on and off of the display device can be controlled. At this time, since the intensity of the electric field between the pixel electrode 180 and the common electrode 182 increases due to the metal particles 156, the driving voltage of the quantum rod layer 150 can be lowered.

Meanwhile, when the quantum rods 152 are disorderedly dispersed, a voltage is applied to the pixel electrode 180 and the common electrode 182 to thereby generate the electric field E, and then the quantum rods 152 are arranged such that their long axes are parallel to the electric field E. At this time, by hardening the quantum rod layer 150, it is maintained that the long axes of the quantum rods 152 are parallel to the electric filed E generated between the pixel electrode 180 and the common electrode 182. Accordingly, an alignment layer and an aligning process, which are needed for the related art liquid crystal display device, can be omitted.

Alternatively, the quantum rods 152 may be arranged parallel to the electric filed E through an aligning process.

In addition, since the quantum rods 152 can emit visible light of red, green and blue, color filters, which are needed to produce colors in the related art liquid crystal display device, can be omitted.

By the way, when the quantum rod layer 150 includes the quantum rods 152 and the metal particles 156 like the quantum rod panel 110 and the quantum rod display device 100 according to the first embodiment of the present disclosure, there is a problem that the photoluminescence rapidly decreases.

This may be caused by electrical contact between the metal particles 156 and the quantum rods 152 and may be referred to as quenching.

Namely, in the quantum rod display device 100 according to the first embodiment of the present disclosure, since the quantum rod layer 150 includes the quantum rods 152 and the metal particles 156, the intensity of the electric field between the pixel electrode 180 and the common electrode 182 increases, and the driving voltage decreases. However, the photoluminescence is lowered because of the quenching problem of the quantum rods 152 due to the metal particles 156.

<Second Embodiment>

Figure 4:
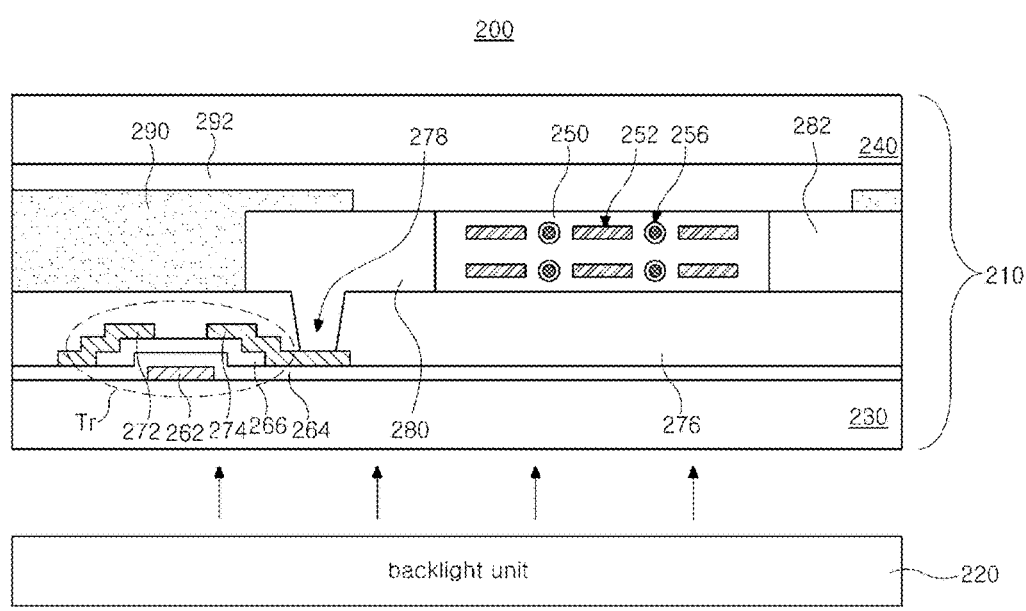
FIG. 4 is a schematic cross-sectional view of a quantum rod display device according to a second embodiment of the present disclosure.

FIG. 4 is a schematic cross-sectional view of a quantum rod display device according to a second embodiment of the present disclosure.

In FIG. 4, a quantum rod display device 200 according to the second embodiment of the present disclosure includes a quantum rod panel 210 and a backlight unit 220 under the quantum rod panel 210. The backlight unit 220 provides light to the quantum rod panel 210.

The quantum rod panel 210 includes a first substrate 230, which is adjacent to the backlight unit 220, pixel and common electrodes 280 and 282, which are positioned over the first substrate 230, a second substrate 240, which faces the first substrate 230, and a quantum rod layer 250, which is positioned between the first and second substrates 230 and 240 and includes quantum rods 252 and insulator-coated metal particles 256.

Each of the first and second substrates 230 and 240 may be a glass substrate or a plastic substrate. For example, when the first and second substrates 230 and 240 each are flexible substrates such as polyimide, the quantum rod display device 200 of the present disclosure may be used as a foldable, bendable or rollable display device.

A gate line and a data line are formed over the first substrate 230 and cross each other to define each of a plurality of pixel regions. A gate insulating layer 264 is disposed between the gate line and the data line.

A thin film transistor Tr is formed in each pixel region, and the pixel electrode 280 is electrically connected to the thin film transistor Tr.

The thin film transistor Tr may include a gate electrode 262 formed over the first substrate 230, a semiconductor layer 266 formed over the gate electrode 262 and overlapping the gate electrode 262, and source and drain electrodes 272 and 274 spaced apart from each other over the semiconductor layer 266.

A passivation layer 276 is formed over and covers the thin film transistor Tr, and the passivation layer 276 has a drain contact hole 278 exposing the drain electrode 274. The pixel electrode 280 and the common electrode 282 are disposed on the passivation layer 276. The pixel electrode 280 is connected to the drain electrode 274 through the drain contact hole 278. Additionally, the common electrode 282 is spaced apart from the pixel electrode 280. The pixel electrode 280 and the common electrode 282 may extend parallel to each other.

Each of the pixel electrode 280 and the common electrode 282 may be formed of a reflective conductive material such as aluminum (Al), aluminum alloy (AlNd), molybdenum (Mo), copper (Cu) and copper alloy or a transparent conductive material such as indium tin oxide (ITO) and indium zinc oxide (IZO).

In addition, a partition wall 290 is formed on the passivation layer 276 to divide pixel regions. That is, the partition wall 290 may surround each pixel region and have a lattice shape. The quantum rod layer 250 is divided into the pixel regions by the partition wall 290, and red, green and blue can be produced in the respective pixel regions. The partition wall 290 can be omitted.

Moreover, the quantum rod layer 250 is disposed on the passivation layer 276 and is divided into the pixel regions by the partition wall 290. Namely, the quantum rod layer 250 contacts the pixel electrode 280 and the common electrode 282. Furthermore, a bottom surface of the quantum rod layer 250 contacts the passivation layer 276.

The quantum rod layer 250 includes the quantum rods 252 and the insulator-coated metal particles 256. In addition, the quantum rod layer 250 may be formed through a soluble process and may further include a binder.

As explained by referring to FIG. 2, similarly each quantum rod 252 includes a core and a shell covering the core and has a rod shape. Each of the core and the shell may include at least one of II-VI, III-V or VI-IV semiconductor materials.

The insulator-coated metal particles 256 are dispersed together with the quantum rods 252 in the binder and have relatively low resistivity. Therefore, an intensity of an electric field generated between the pixel electrode 280 and the common electrode 282 increases due to the insulator-coated metal particles 256, and a driving voltage of the quantum rods 252 decreases.

Figure 5:
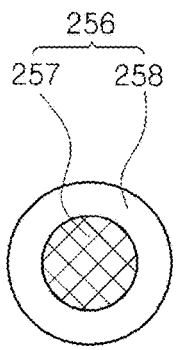
FIG. 5 is a schematic cross-sectional view of an insulator-coated metal particle according to an example of the present disclosure.

Referring to FIG. 5, which is a schematic cross-sectional view of an example of an insulator-coated metal particle (e.g., 256 of FIG. 4), each insulator-coated metal particle 256 has a structure including a core 257 of a metal and a shell 258 of an insulating material covering the core 257. Namely, a surface of the core 257 is coated with the shell 258.

It is beneficial that the metal core 257 has relatively high reflectivity and the shell 258 of the insulating material has a light-transmitting property (transparency). That is, the insulator-coated metal particles 256 reflect light from the backlight unit 220, and the absorbance of the quantum rods 252 increases. Thus, the photoluminescence of the quantum rod panel 210 and the quantum rod display device 200 can be improved.

For instance, the metal core 257 may be formed of a metal material having relatively low resistivity and high reflectance such as gold (Au), silver (Ag), titanium (Ti) and aluminum (Al). The shell 258 of the insulating material may be formed of a transparent inorganic insulating material such as silica, silicon oxide and silicon nitride.

Moreover, the insulator-coated metal particles 256 may be included as lower weight ratios than the quantum rods 252.

For example, the insulator-coated metal particles 256 may have a size of 100 to 300 nm and the content of about 1 to 15 wt % with respect to the quantum rods 252.

In the quantum rod panel 210 and the quantum rod display device 200, electrons and holes are separated by an electric field generated between the pixel electrode 280 and the common electrode 282, thereby controlling on and off of the quantum rod panel 210 and the quantum rod display device 200. At this time, to turn off the quantum rods 252, an electric field may be needed to have the intensity higher than an energy barrier between the core 153 of FIG. 2 and the shell 154 of FIG. 2, and thus a driving voltage of the quantum rod panel and the quantum rod display device may increase.

However, in the present disclosure, since the quantum rod layer 250 includes the quantum rods 252 and the insulator-coated metal particles 256, the intensity of the electric field generated between the pixel electrode 280 and the common electrode 282 increases. Accordingly, the driving voltage of the quantum rod panel 210 and the quantum rod display device 200 is decreased, and the power consumption is lowered.

Moreover, there is no problem of a decrease in the photoluminescence due to quenching of the quantum rods 252 because the metal core 257 is covered with the shell 258 of the insulating material.

Table 1 below shows photoluminescence repeatedly measured after driving each of a quantum rod display device (Ref) without metal particles, a quantum rod display device (Ex) with metal particles, and a quantum rod display device (Ex(shell)) with insulator-coated metal particles by 50V for 30 seconds.

TABLE 1

|  | Ref | Ex | Ex(shell) |
| --- | --- | --- | --- |
| 0 V | 361 | 363 | 370 |
| 50 V | 88 | 32 | 44 |
| 0 V | 360 | 224 | 372 |
| 50 V | 87 | 28 | 45 |
| 0 V | 362 | 50 | 371 |
| 50 V | 86 | 25 | 43 |
| 0 V | 361 | 12 | 372 |

As shown in Table 1, the photoluminescence (0V) of the quantum rod display device (Ex) with the metal particles according to the first embodiment of the present disclosure sharply decreases in comparison to the quantum rod display device (Ref) without the metal particles according to the related art.

However, the photoluminescence of the quantum rod display device (Ex(shell)) with the insulator-coated metal particles according to the second embodiment of the present disclosure does not decrease even after being repeatedly driven.

A planarization layer 292 is formed on the partition wall 290 and the quantum rod layer 250. The planarization layer 292 flattens steps, which may be caused by the partition wall 290 and the quantum rod layer 250. The planarization layer 292 may be omitted.

The second substrate 240 is disposed over the planarization layer 292. The second substrate 240 may be attached to the planarization layer 292 by an adhesive layer. The second substrate 240 may be a glass substrate, a plastic substrate, a plastic film, an insulating film, or an encapsulation film. The shape and material of the second substrate 240 are not limited.

The backlight unit 220 includes a UV light source. Namely, since the quantum rods 252 absorb UV and emit visible light, the backlight unit 220 includes the UV light source and provides UV to the quantum rod panel 210.

The backlight unit 220 may be a direct-type in which a plurality of UV light sources are arranged under the quantum rod panel 210 and provide UV directly to the quantum rod panel 210. The direct-type backlight unit 220 may further include a reflection plate under the UV light sources and an optical sheet between the UV light sources and the quantum rod panel 210.

Alternatively, the backlight unit 220 may be an edge-type in which a light guide plate is disposed under the quantum rod panel 210 and the UV light source is disposed at a side of the light guide plate. The edge-type backlight unit 220 may further include a reflection plate under the light guide plate and an optical sheet between the light guide plate and the quantum rod panel 210.

In the present disclosure, the pixel electrode 280 and the common electrode 282 are disposed over the first substrate 230 to generate an in-plane electric field parallel to the first substrate 230.

Namely, as explained by referring to FIG. 3, the quantum rods 252 are arranged such that their long axes are parallel to the electric field E generated between the pixel electrode 280 and the common electrode 282, and the insulator-coated metal particles 256 are arranged between the quantum rods 252. That is to say, the quantum rods 252 are arranged such that their long axes are perpendicular to the extension direction of the pixel electrode 280 and the common electrode 282.

Like this, when the UV from the backlight unit 220 is provided to the quantum rod layer 250, which includes the quantum rods 252 arranged perpendicularly to the extension direction of the pixel electrode 280 and the common electrode 282, visible light linearly polarized in a direction of the long axes of the quantum rods 252 is emitted from the quantum rods 252.

In the meantime, when the electric field E is applied to the quantum rod layer 250, the quantum rods 252 do not emit light. Therefore, by using the in-plane electric field between the pixel electrode 280 and the common electrode 282, the polarization properties of the quantum rod panel 210 and the quantum rod display device 200 are improved, and on and off of the display device can be controlled. At this time, since the intensity of the electric field between the pixel electrode 280 and the common electrode 282 increases due to the insulator-coated metal particles 256, the driving voltage of the quantum rod layer 250 can be lowered.

In addition, the shell 258 of the insulating material prevents quenching of the quantum rods 252 due to the metal particles, and thus the photoluminescence of the quantum rod display device 200 is prevented from being lowered.

Comparison of Characteristics of Quantum Rod Display Devices

Figure 6:
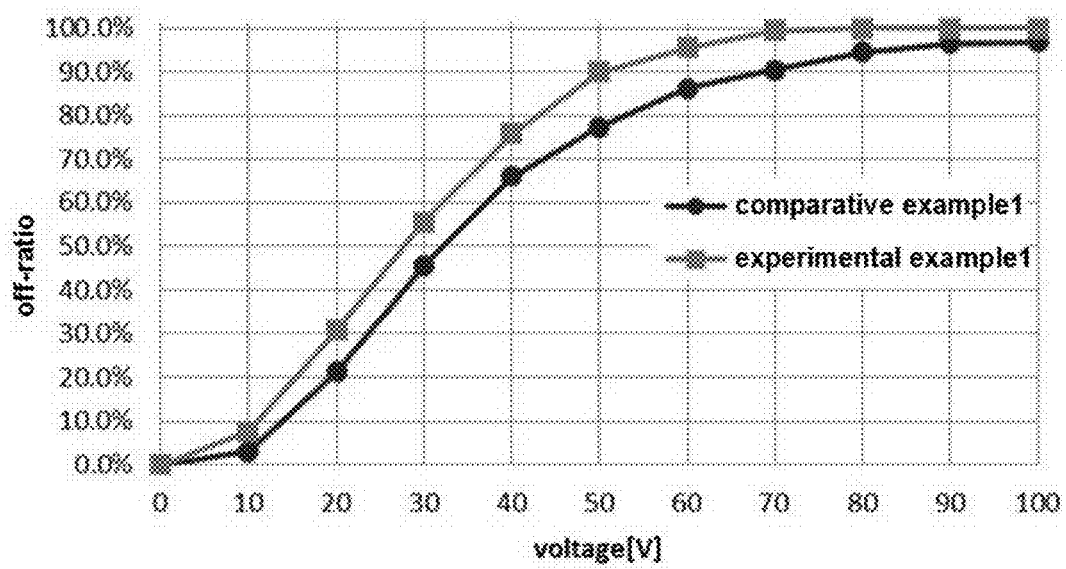
FIG. 6 is a graph for explaining off characteristics of a quantum rod display device according to the second embodiment of the present disclosure.

Table 2 below and FIG. 6 show off-ratios of quantum rod display devices of a comparative example 1 and an experimental example 1. The quantum rod layer of the comparative example 1 includes the quantum rods without the insulator-coated metal particles, and the quantum rod layer of the experimental example 1 includes the quantum rods and the insulator-coated metal particles according to the embodiment(s) of the present disclosure. Here, the insulator-coated metal particles including Ti core surrounded by silica shell and having a diameter of 200 nm were added to the quantum rods at the content of 6 wt %.

Here, the off-ratio is a ratio of the photoluminescence in the state when a voltage is applied to the photoluminescence in the state when no voltage is applied. That is, off-ratio=1−(PLoff/PLon), wherein PLoff is the photoluminescence in the state when no voltage is applied, and PLon is the photoluminescence in the state when a voltage is applied.

TABLE 2

| Voltage | comparative example 1 | experimental example 1 |
|---|---|---|
| 0 | 0.0% | 0.0% |
| 10 | 3.1% | 7.6% |
| 20 | 21.2% | 30.7% |
| 30 | 45.4% | 55.5% |
| 40 | 66.0% | 75.9% |
| 50 | 77.3% | 90.0% |
| 60 | 86.2% | 95.5% |
| 70 | 90.4% | 99.4% |
| 80 | 94.5% | 100.0% |
| 90 | 96.4% | 100.0% |
| 100 | 96.8% | 100.0% |

As shown in Table 2 and FIG. 6, the off-ratio of the experimental example 1 is higher than the off-ratio of the comparative example 1 at the same voltage. Thus, the quantum rod display device in which the quantum rod layer includes the quantum rods and the insulator-coated metal particles have the improved off characteristics. That is, the intensity of the electric field generated between the pixel electrode and the common electrode increases due to the insulator-coated metal particles, and the higher off-ratio can be obtained at the same driving voltage.

Figure 7A:
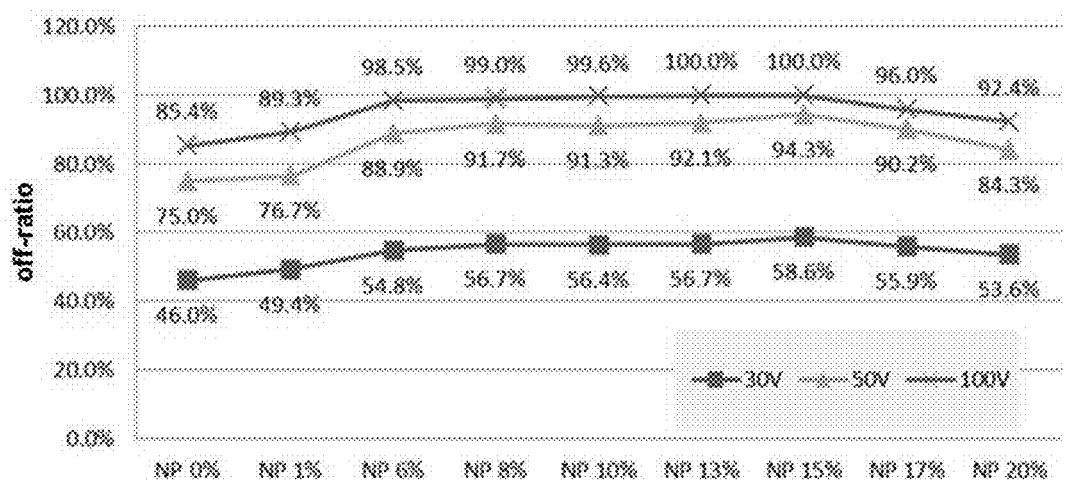
FIG. 7A and FIG. 7B are graphs for explaining off characteristics and photoluminescence characteristics depending on the content of insulator-coated metal particles, respectively.
Figure 7B:
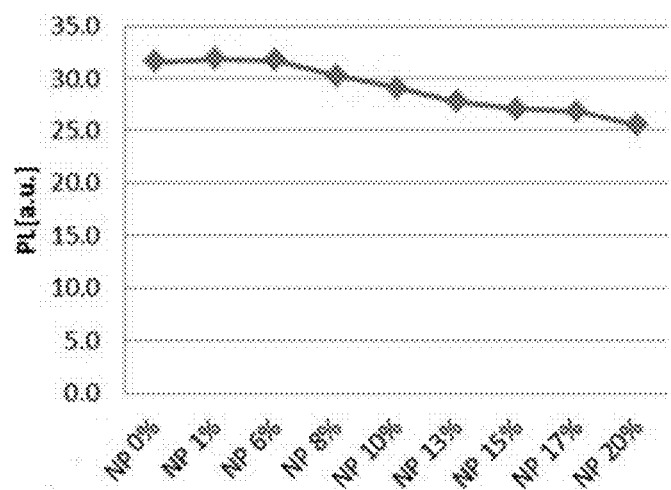

In the quantum rod display device with the quantum rod layer including the quantum rods and the insulator-coated metal particles, off-ratios and photoluminescence (PL) were measured according to weight ratios of the insulator-coated metal particles (NP) with respect to the quantum rods. FIG. 7A shows the off-ratios, and Table 3 below and FIG. 7B show the photoluminescence.

TABLE 3

| | NP [wt %] | | | | | | | | |
|---|---|---|---|---|---|---|---|---|---|
| | 0% | 1% | 6% | 8% | 10% | 13% | 15% | 17% | 20% |
| PL | 31.6 | 31.9 | 31.8 | 30.3 | 29.2 | 27.8 | 27.1 | 26.9 | 25.5 |

As shown in FIG. 7A, the off-ratio increases in the quantum rod display device with the quantum rod layer including the insulator-coated metal particles. Namely, the driving voltage of the quantum rod display device decreases.

Meanwhile, the off-ratio increases as the content (weight ratios) of the insulator-coated metal particles increases, and the off-ratio decreases after being saturated in a predetermined range (for example, about 13 to 15 wt %).

In addition, referring to Table 3 and FIG. 7B, the photoluminescence maintains constantly or is improved in a predetermined content range of the insulator-coated metal particles (for example, about 1 to 6 wt %), and then the photoluminescence decreases as the content of the insulator-coated metal particles increases. The decrease in the photoluminescence may result from a decrease in the amount of light absorbed by the quantum rods from the backlight unit because of the insulator-coated metal particles.

According to these experimental results, the insulator-coated metal particles may be added to the quantum rods at the content of about 1 to 15 wt %. That is, the off-ratio may be maximized in the range of the weight ratios, and the driving voltage of the quantum rod panel and the quantum rod display device can be lowered.

Moreover, it is beneficial that the insulator-coated metal particles are added to the quantum rods at the content of about 1 to 6 wt % considering the off-ratio and the photoluminescence of the quantum rod panel and the quantum rod display device.

Figure 8A:
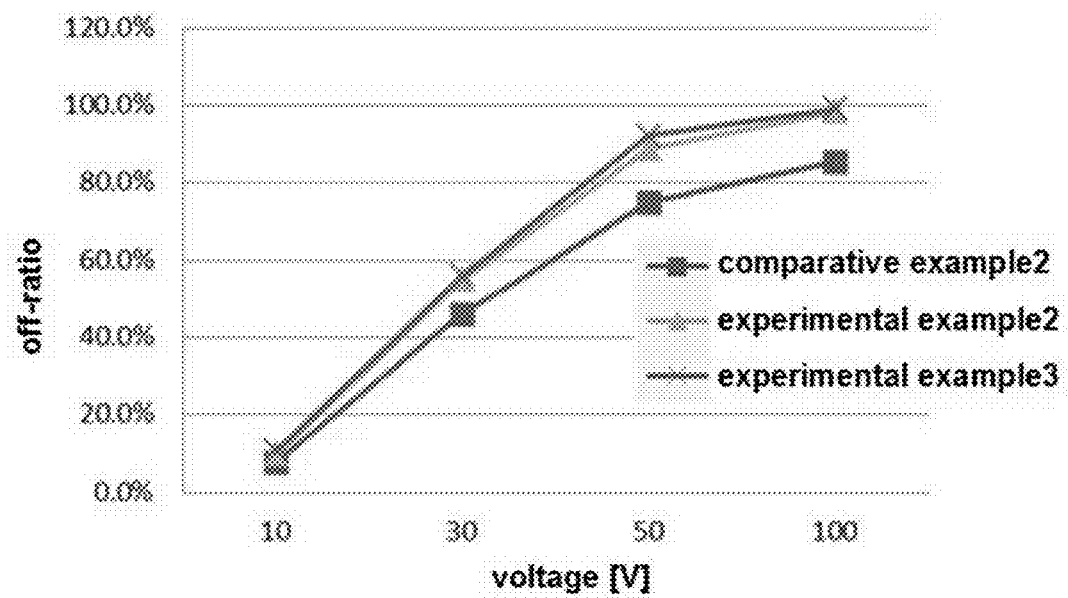
FIG. 8A and FIG. 8B are graphs for explaining off characteristics and photoluminescence characteristics depending on a metal material of insulator-coated metal particles, respectively.
Figure 8B:
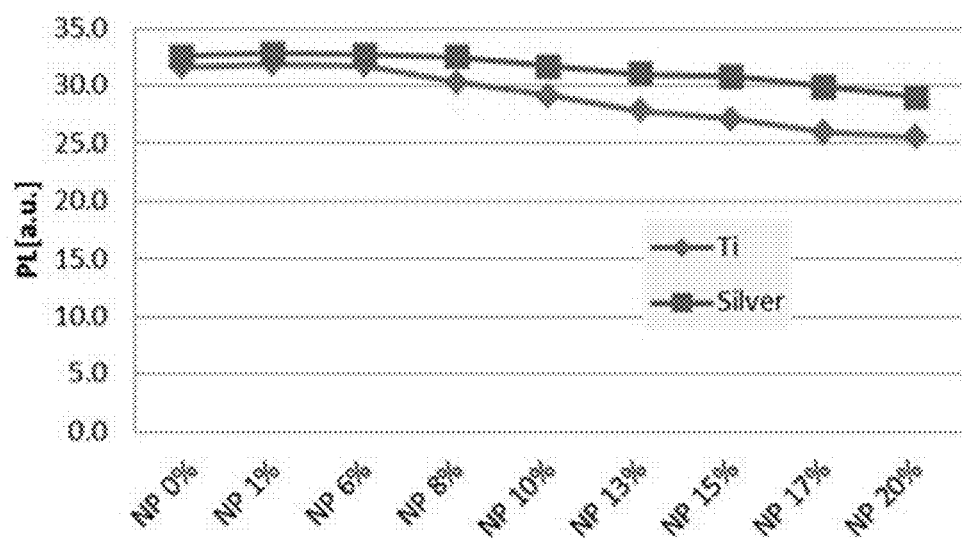

In the quantum rod display device with the quantum rod layer including the quantum rods and the insulator-coated metal particles, off-ratios and photoluminescence were measured according to a material of the metal core. Table 4 below and FIG. 8A show the off-ratios, and Table 5 and FIG. 8B show the photoluminescence. In each of an experimental example 2 and an experimental example 3 according to the embodiment(s) of the present disclosure, the insulator-coated metal particles including Ti and Ag (silver) core surrounded by silica shell and having a diameter of 200 nm were used as the content of 6 wt %.

TABLE 4

| V | comparative example 2 | experimental example 2 | experimental example 3 |
|---|---|---|---|
| 10 | 7.8% | 9.8% | 10.7% |
| 30 | 46.0% | 54.8% | 56.0% |
| 50 | 75.0% | 88.9% | 92.2% |
| 100 | 85.4% | 98.5% | 99.1% |

TABLE 5

| | NP [wt %] | | | | | | | | |
|---|---|---|---|---|---|---|---|---|---|
| | 0% | 1% | 6% | 8% | 10% | 13% | 15% | 17% | 20% |
| Ti | 31.6 | 31.9 | 31.8 | 30.3 | 29.2 | 27.8 | 27.1 | 26.0 | 25.5 |
| Silver | 32.6 | 32.8 | 32.7 | 32.5 | 31.7 | 31.0 | 30.8 | 29.9 | 29.0 |

As shown in Table 4 and FIG. 8A, the off-ratio of the quantum rod display device does not vary greatly depending on the material of the metal core. That is, the experimental examples 2 and 3, in which the quantum rod layer includes the insulator-coated metal particles with the metal core of Ti or Ag having relatively low resistivity, have the increased off-ratios as compared with the comparative example 2, in which the quantum rod layer does not include the insulator-coated metal particles, and the off-ratios of the experimental examples 2 and 3 are not greatly influenced by the kind of the metal core.

On the other hand, as shown in Table 5 and FIG. 8B, the photoluminescence of the quantum rod display device is reduced as the content of the insulator-coated metal particles increases. By the way, when the metal core is made of Ag having relatively high reflectivity, the amount of light absorbed by the quantum rods after being reflected by the insulator-coated metal particles from the backlight unit increases, and thus the photoluminescence is high.

<Third Embodiment>

Figure 9:
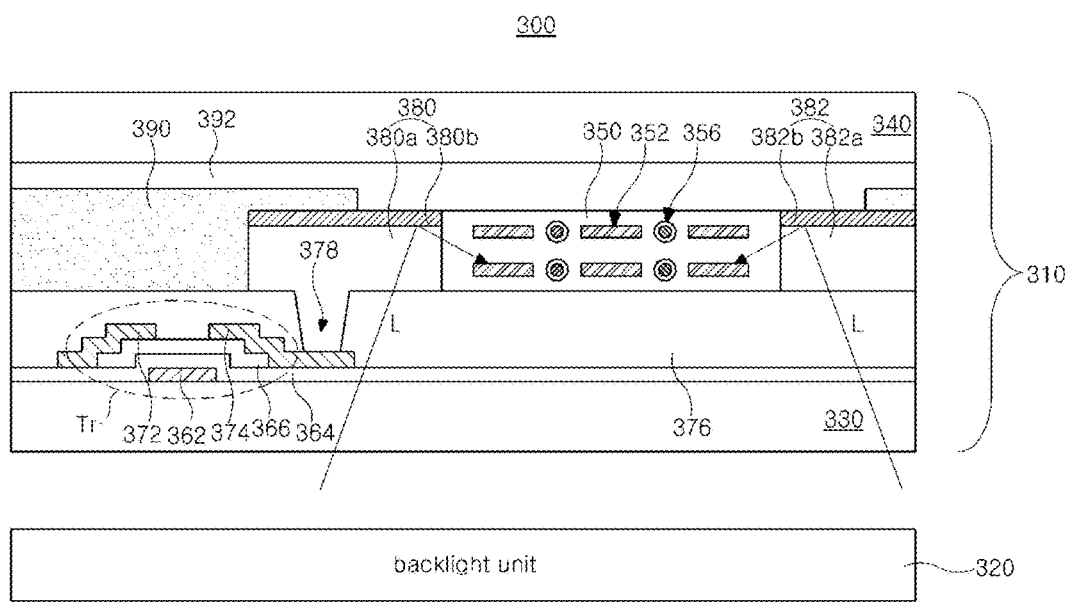
FIG. 9 is a schematic cross-sectional view of a quantum rod display device according to a third embodiment of the present disclosure.

FIG. 9 is a schematic cross-sectional view of a quantum rod display device according to a third embodiment of the present disclosure.

In FIG. 9, a quantum rod display device 300 according to the third embodiment of the present disclosure includes a quantum rod panel 310 and a backlight unit 320 under the quantum rod panel 310. The backlight unit 320 provides light to the quantum rod panel 310.

The quantum rod panel 310 includes a first substrate 330, which is adjacent to the backlight unit 320, pixel and common electrodes 380 and 382, which are positioned over the first substrate 330, a second substrate 340, which faces the first substrate 330, and a quantum rod layer 350, which is positioned between the first and second substrates 330 and 340 and includes quantum rods 352 and insulator-coated metal particles 356.

Each of the first and second substrates 330 and 340 may be a glass substrate or a plastic substrate. For example, when the first and second substrates 330 and 340 each are flexible substrates such as polyimide, the quantum rod display device 300 of the present disclosure may be used as a foldable, bendable or rollable display device.

A gate line and a data line are formed over the first substrate 330 and cross each other to define each of a plurality of pixel regions. A gate insulating layer 364 is disposed between the gate line and the data line.

A thin film transistor Tr is formed in each pixel region, and the pixel electrode 380 is electrically connected to the thin film transistor Tr.

The thin film transistor Tr may include a gate electrode 362 formed over the first substrate 330, a semiconductor layer 366 formed over the gate electrode 362 and overlapping the gate electrode 362, and source and drain electrodes 372 and 374 spaced apart from each other over the semiconductor layer 366.

A passivation layer 376 is formed over and covers the thin film transistor Tr, and the passivation layer 376 has a drain contact hole 378 exposing the drain electrode 374. The pixel electrode 380 and the common electrode 382 are disposed on the passivation layer 376. The pixel electrode 380 is connected to the drain electrode 374 through the drain contact hole 378. Additionally, the common electrode 382 is spaced apart from the pixel electrode 380. The pixel electrode 380 and the common electrode 382 may extend parallel to each other.

The pixel electrode 380 includes a lower layer 380a of a transparent conductive material and an upper layer 380b of a reflective conductive material over the lower layer 380a. In addition, the common electrode 382 includes a lower layer 382a of a transparent conductive material and an upper layer 382b of a reflective conductive material—over the lower layer 382a.

In FIG. 9, the pixel electrode 380 and the common electrode 382, but not limited to this, have a double-layered structure. For example, the pixel electrode 380 and the common electrode 382 may have a triple-layered structure including different transparent conductive material layers and a reflective conductive material layer thereon or including a transparent conductive material layer and different reflective conductive material layers thereon. Moreover, the pixel electrode 380 and the common electrode 382 may have a quadruple-layered structure including different transparent conductive material layers and different reflective conductive material layers thereon.

For example, the transparent conductive material may be indium tin oxide (ITO) or indium zinc oxide (IZO), and the reflective conductive material may be aluminum (Al), aluminum alloy (AlNd), molybdenum (Mo), copper (Cu) or copper alloy.

In the pixel electrode 380, the lower layer 380a has a first thickness and the upper layer 380b has a second thickness equal to or less than the first thickness. In the common electrode 382, the lower layer 382a has a third thickness and the upper layer 382b has a fourth thickness equal to or less than the third thickness.

In addition, a partition wall 390 is formed on the passivation layer 376 to divide pixel regions. That is, the partition wall 390 may surround each pixel region and have a lattice shape. The quantum rod layer 350 is divided into the pixel regions by the partition wall 390, and red, green and blue can be produced in the respective pixel regions. The partition wall 390 can be omitted.

Moreover, the quantum rod layer 350 is disposed on the passivation layer 376 and is divided into the pixel regions by the partition wall 390. Namely, the quantum rod layer 350 contacts the pixel electrode 380 and the common electrode 382. Furthermore, a bottom surface of the quantum rod layer 350 contacts the passivation layer 376.

The quantum rod layer 350 includes the quantum rods 352 and the insulator-coated metal particles 356. In addition, the quantum rod layer 350 may be formed through a soluble process and may further include a binder.

As explained by referring to FIG. 2, similarly each quantum rod 352 includes a core and a shell covering the core and has a rod shape. Each of the core and the shell may include at least one of II-VI, III-V or VI-IV semiconductor materials.

The insulator-coated metal particles 356 are dispersed together with the quantum rods 352 in the binder and have relatively low resistivity. Therefore, an intensity of an electric field generated between the pixel electrode 380 and the common electrode 382 increases due to the insulator-coated metal particles 356, and a driving voltage of the quantum rods 352 decreases.

As explained by referring to FIG. 5, each insulator-coated metal particle 356 has a structure including a core of a metal and a shell of an insulating material covering the core. Namely, a surface of the core is coated with the shell.

It is beneficial that the metal core has relatively high reflectivity and the shell of the insulating material has a light-transmitting property (transparency). That is, the insulator-coated metal particles 356 reflect light from the backlight unit 320, and the absorbance of the quantum rods 352 increases. Thus, the photoluminescence of the quantum rod panel 310 and the quantum rod display device 300 can be improved.

For instance, the metal core may be formed of a metal material having relatively low resistivity and high reflectance such as gold (Au), silver (Ag), titanium (Ti) and aluminum (Al). The shell of the insulating material may be formed of a transparent inorganic insulating material such as silica, silicon oxide and silicon nitride.

A planarization layer 392 is formed on the partition wall 390 and the quantum rod layer 350. The planarization layer 392 flattens steps, which may be caused by the partition wall 390 and the quantum rod layer 350. The planarization layer 392 may be omitted.

The second substrate 340 is disposed over the planarization layer 392. The second substrate 340 may be attached to the planarization layer 392 by an adhesive layer. The second substrate 340 may be a glass substrate, a plastic substrate, a plastic film, an insulating film, or an encapsulation film. The shape and material of the second substrate 340 are not limited.

The backlight unit 320 includes a UV light source. Namely, since the quantum rods 352 absorb UV and emit visible light, the backlight unit 320 includes the UV light source and provides UV to the quantum rod panel 310.

The backlight unit 320 may be a direct-type in which a plurality of UV light sources are arranged under the quantum rod panel 310 and provide UV directly to the quantum rod panel 310. The direct-type backlight unit 320 may further include a reflection plate under the UV light sources and an optical sheet between the UV light sources and the quantum rod panel 310.

Alternatively, the backlight unit 320 may be an edge-type in which a light guide plate is disposed under the quantum rod panel 310 and the UV light source is disposed at a side of the light guide plate. The edge-type backlight unit 320 may further include a reflection plate under the light guide plate and an optical sheet between the light guide plate and the quantum rod panel 310.

In the present disclosure, since the quantum rod layer 350 includes the quantum rods 352 and the insulator-coated metal particles 356 and thus the intensity of the electric field generated between the pixel electrode 380 and the common electrode 382 increases, the driving voltage of the quantum rod panel 310 and the quantum rod display device 300 is reduced, and the power consumption is lowered.

Meanwhile, the photoluminescence of the quantum rod display device 300 may be reduced because the quantum rod layer 350 includes the insulator-coated metal particles 356. However, in the present disclosure, the photoluminescence can be prevented from being lowered because of the structures of the pixel electrode 380 and the common electrode 382.

Namely, in the quantum rod display device 300 according to the third embodiment of the present disclosure, the quantum rod layer 350 is driven by the in-plane electric field generated between the pixel electrode 380 and the common electrode 382, and light L incident on the pixel electrode 380 and the common electrode 382 from the backlight unit 320 passes through the lower layers 380a and 382a of the transparent conductive material and then is reflected by the upper layer 380b and 382b. Since the reflected light L is provided to the quantum rods 352 positioned between the pixel electrode 380 and the common electrode 382, the amount of light absorbed by the quantum rods 352 can be increased.

Accordingly, loss of light, which may occur due to the insulator-coated metal particles 356, is compensated for, and the photoluminescence of the quantum rod display device 300 is prevented from being lowered.

Moreover, in the pixel electrode 380 and the common electrode 382, since the lower layers 380*a* and 382*a* of the transparent conductive material have relatively thick thicknesses, it is possible to supply a space enough to provide the quantum rods 352 with the light L reflected by the upper layers 380*b* and 382*b* of the reflective conductive material.

For example, in general, the pixel electrode and the common electrode need relatively low resistance. Thus, when the pixel electrode and the common electrode have a multiple-layered structure of the transparent conductive material layer and the metal material layer having the reflective property and low resistivity, the metal material layer has a thicker thickness than the transparent conductive material layer.

However, in the present disclosure, since UV from the backlight unit 320 is reflected by the upper layers 380*b* and 382*b* of the pixel electrode 380 and the common electrode 382 and is provided to the quantum rods 352, the lower layers 380*a* and 382*a* of the transparent conductive material have a thickness equal to or thicker than the upper layers 380*b* and 382*b* of the reflective conductive material.

Namely, in the quantum rod panel 310 and the quantum rod display device 300 according to the present disclosure, the off-ratio increases without a decrease in the photoluminescence, and the driving voltage decreases.

In the quantum rod panel and the quantum rod display device of the present disclosure, the quantum rod layer includes the metal particles or the insulator-coated metal particles and quantum rods, and the off-ratio of the quantum road layer increases.

Accordingly, it is possible to provide a quantum rod panel and a quantum rod display device having a low driving voltage and power consumption.

In addition, in the quantum rod panel and the quantum rod display device of the present disclosure, the quantum rod layer is driven by the in-plane electric field generated between the pixel electrode and the common electrode, so that the polarization characteristics of the quantum rod panel and the quantum rod display device are improved.

In addition, in the quantum rod panel and the quantum rod display device of the present disclosure, the pixel electrode and the common electrode have a multiple-layered structure of the transparent conductive material layer and the reflective conductive material layer, and the problem of a decrease in the photoluminescence due to the metal particles or the insulator-coated metal particles can be prevented or minimized.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. A quantum rod panel comprising:
   a first substrate and a second substrate facing each other;
   a pixel electrode and a common electrode over the first substrate and spaced apart from each other; and
   a quantum rod layer between the pixel electrode and the common electrode and including quantum rods and metal particles,
   wherein the metal particles are formed only of metal and are reflective,
   wherein the metal particles increase an intensity of an electric field generated between the pixel electrode and the common electrode,
   wherein the quantum rod layer has a same thickness as each of the pixel electrode and the common electrode.

2. The quantum rod panel of claim 1, wherein the metal particles are insulator-coated metal particles, each of the insulator-coated metal particles being surrounded by an insulating material.

3. The quantum rod panel of claim 2, wherein the insulating material has a light-transmitting property.

4. The quantum rod panel of claim 2, wherein the insulating material includes one of silica, silicon oxide, and silicon nitride.

5. The quantum rod panel of claim 2, wherein the insulator-coated metal particles have a content of approximately 1 to 15 wt % with respect to the quantum rods.

6. The quantum rod panel of claim 1, wherein the metal particles include one of gold, silver, titanium and aluminum, and have a size of about 100 nm to about 300 nm.

7. The quantum rod panel of claim 1, wherein each of the pixel electrode and the common electrode includes:
   a lower layer of a transparent conductive material, and
   an upper layer of a reflective conductive material.

8. The quantum rod panel of claim 7, wherein the lower layer has a thickness greater than a thickness of the upper layer.

9. The quantum rod panel of claim 8, wherein light incident on the pixel electrode and the common electrode from a backlight unit is reflected by the upper layer, and the reflected light is provided to the quantum rods.

10. The quantum rod panel of claim 1, wherein long axes of the quantum rods are perpendicular to an extension direction of the pixel electrode, and the metal particles are located at locations between adjacent quantum rods and aligned with the long axes of the adjacent quantum rods.

11. The quantum rod panel of claim 1, further comprising a thin film transistor over the first substrate and connected to the pixel electrode.

12. The quantum rod panel of claim 1, further comprising a planarization layer between the quantum rod layer and the second substrate, and the planarization layer directly contacting the quantum rod layer, the pixel electrode and the common electrode.

13. A quantum rod display device comprising:
   a quantum rod panel including:
   a first substrate and a second substrate facing each other,
   a pixel electrode and a common electrode over the first substrate and spaced apart from each other, and
   a quantum rod layer between the pixel electrode and the common electrode and including quantum rods and metal particles, the metal particles being formed only of metal and being reflective; and
   a backlight unit under the quantum rod panel,
   wherein the metal particles increase an intensity of an electric field generated between the pixel electrode and the common electrode, and
   wherein the quantum rod layer has a same thickness as each of the pixel electrode and the common electrode.

14. The quantum rod display device of claim 13, wherein the metal particles are insulator-coated metal particles, each of the insulator-coated metal particles being surrounded by an insulating material.

15. The quantum rod display device of claim 14, wherein the insulating material has a light-transmitting property.

16. The quantum rod display device of claim 14, wherein the insulating material includes one of silica, silicon oxide, and silicon nitride.

17. The quantum rod display device of claim 14, wherein the insulator-coated metal particles have a content of approximately 1 to 15 wt % with respect to the quantum rods.

18. The quantum rod display device of claim 13, wherein the metal particles include one of gold, silver, titanium and aluminum, and have a size of about 100 nm to about 300 nm.

19. The quantum rod display device of claim 13, wherein each of the pixel electrode and the common electrode includes:
 a lower layer of a transparent conductive material, and
 an upper layer of a reflective conductive material.

20. The quantum rod display device of claim 19, wherein the lower layer has a thickness greater than a thickness of the upper layer.

21. The quantum rod display device of claim 20, wherein light incident on the pixel electrode and the common electrode from the backlight unit is reflected by the upper layer, and the reflected light is provided to the quantum rods.

22. The quantum rod display device of claim 13, wherein long axes of the quantum rods are perpendicular to an extension direction of the pixel electrode, and the metal particles are located at locations between adjacent quantum rods and aligned with the long axes of the adjacent quantum rods.

23. The quantum rod display device of claim 13, wherein the quantum rod panel further includes a thin film transistor over the first substrate and connected to the pixel electrode.

24. The quantum rod display device of claim 13, further comprising a planarization layer between the quantum rod layer and the second substrate, and the planarization layer directly contacting the quantum rod layer, the pixel electrode and the common electrode.

\* \* \* \* \*